US012557567B2

(12) United States Patent
Suemoto et al.

(10) Patent No.: US 12,557,567 B2
(45) Date of Patent: Feb. 17, 2026

(54) LAMINATED FILM, STRUCTURE INCLUDING LAMINATED FILM, SEMICONDUCTOR ELEMENT, ELECTRONIC DEVICE, AND METHOD FOR PRODUCING LAMINATED FILM

(71) Applicant: TOSOH CORPORATION, Yamaguchi (JP)

(72) Inventors: Yuya Suemoto, Kanagawa (JP); Yoshihiro Ueoka, Kanagawa (JP); Masami Mesuda, Kanagawa (JP)

(73) Assignee: TOSOH CORPORATION, Yamaguchi (JP)

( * ) Notice: Subject to any disclaimer, the term of this patent is extended or adjusted under 35 U.S.C. 154(b) by 533 days.

(21) Appl. No.: 17/907,674

(22) PCT Filed: Mar. 29, 2021

(86) PCT No.: PCT/JP2021/013330
§ 371 (c)(1),
(2) Date: Sep. 29, 2022

(87) PCT Pub. No.: WO2021/200836
PCT Pub. Date: Oct. 7, 2021

(65) Prior Publication Data

US 2023/0143194 A1 May 11, 2023

(30) Foreign Application Priority Data

Mar. 30, 2020 (JP) ................................ 2020-060747

(51) Int. Cl.
*H01L 21/02* (2006.01)
*C23C 14/06* (2006.01)
(Continued)

(52) U.S. Cl.
CPC .... *H01L 21/02378* (2013.01); *C23C 14/0617* (2013.01); *C23C 14/3407* (2013.01);
(Continued)

(58) Field of Classification Search
None
See application file for complete search history.

(56) References Cited

U.S. PATENT DOCUMENTS

2012/0001195 A1* 1/2012 Makabe .............. H10D 30/015 257/E29.002
2013/0026482 A1 1/2013 Fenwick
(Continued)

FOREIGN PATENT DOCUMENTS

CN 103262214 A 8/2013
CN 103415934 A 11/2013
(Continued)

OTHER PUBLICATIONS

Yoshiki Yano et al., "High Speed Growth of Nitride-Based Electronic Device Structure on Large Diameter Silicon Substrate with MOCVD", Taiyo Nippon Sanso Technical Report No. 32, Nov. 29, 2013, pp. 27-pp. 28, 5pp.
(Continued)

*Primary Examiner* — David Sample
(74) *Attorney, Agent, or Firm* — HAUPTMAN HAM, LLP

(57) ABSTRACT

Provided are a crack-free laminated film and a structure including this laminated film. This laminated film includes: a buffer layer; and at least one layer of gallium nitride base film disposed on the buffer layer. Moreover, the compression stress of the entire laminated film is −2.0 to 5.0 GPa.

11 Claims, 1 Drawing Sheet

(51) Int. Cl.
*C23C 14/34* (2006.01)
*C23C 14/54* (2006.01)

(52) U.S. Cl.
CPC ........ *C23C 14/54* (2013.01); *H01L 21/02381* (2013.01); *H01L 21/02433* (2013.01); *H01L 21/02458* (2013.01); *H01L 21/0254* (2013.01); *H01L 21/02631* (2013.01)

(56) References Cited

U.S. PATENT DOCUMENTS

| | | | | |
|---|---|---|---|---|
| 2013/0082274 | A1 | 4/2013 | Yang et al. | |
| 2013/0217212 | A1* | 8/2013 | Yang | H01L 21/02381 257/E21.09 |
| 2013/0306979 | A1 | 11/2013 | Iwami et al. | |
| 2014/0377459 | A1* | 12/2014 | Kawashima | G01N 21/1702 399/221 |
| 2015/0340555 | A1* | 11/2015 | Yang | H10H 20/811 257/76 |
| 2017/0256403 | A1 | 9/2017 | Chen et al. | |

FOREIGN PATENT DOCUMENTS

| | | | |
|---|---|---|---|
| CN | 109524292 | A | 3/2019 |
| CN | 110574144 | A | 12/2019 |
| JP | 2012164717 | A | 8/2012 |
| JP | 2014512681 | A | 5/2014 |
| JP | 2016154221 | A | 8/2016 |
| WO | 2013049417 | A2 | 4/2013 |

OTHER PUBLICATIONS

Michiko Suzuki et al., “Mechanism of stress control for GaN growth on Si using AlN interlayers”, Journal of Crystal Growth, 2017, 464, p. 148-152, 5pp.

* cited by examiner

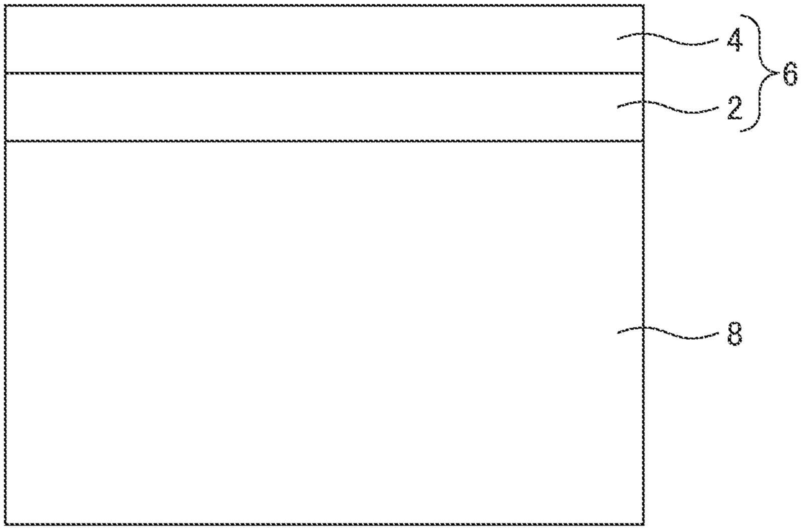
10

LAMINATED FILM, STRUCTURE INCLUDING LAMINATED FILM, SEMICONDUCTOR ELEMENT, ELECTRONIC DEVICE, AND METHOD FOR PRODUCING LAMINATED FILM

TECHNICAL FIELD

This application is a national stage entry according to 35 U.S.C. 371 of PCT Application No. PCT/JP2021/013330 filed on Mar. 29, 2021, which claims priority from Japanese Patent Application No. 2020-060747, filed Mar. 30, 2020, which is incorporated herein by reference in its entirety.

The present invention relates to a laminated film, a structure including the laminated film, a semiconductor element, an electronic device, and a method for producing the laminated film.

BACKGROUND ART

In a gallium nitride (GaN) film formed on a silicon (Si) substrate or a silicon carbide (SiC) substrate, it is known that a difference in the thermal expansion coefficient in a cooling process after high-temperature film formation causes a tensile stress in an in-plane direction and thereby causes warping and cracking. To address this problem, a technique of alternately stacking AlN films and AlGaN films to reduce tensile stress and to prevent cracking has been known (see Non-Patent Document 1).

Non-Patent Document 1: YANO Yoshiki, High Speed Growth of Nitride-Based Electronic Device Structure on Large Diameter Silicon Substrate with MOCVD, TAIYO NIPPON SANSO Technical Report, No. 32 (2013)

DISCLOSURE OF THE INVENTION

Problems to be Solved by the Invention

In a metal-organic chemical vapor deposition method, which is a known gallium nitride film formation method, a film is formed at a high temperature of 1000° C. or more. Thus, during cooling from the film-forming temperature to room temperature, a difference in the thermal expansion coefficient generated between a substrate and gallium nitride causes internal stress in a gallium nitride thin film. In particular, when a gallium nitride film is formed on a substrate of Si, SiC, or the like with a smaller thermal expansion coefficient than GaN, the cooling process tends to cause a tensile stress in the gallium nitride and cause cracking in the gallium nitride film. Furthermore, in a method of alternately stacking AlN films and AlGaN films, which is proposed to prevent cracking, the multilayer structure increases the film thickness and may consequently increase cost.

The present inventors have completed the present invention by finding that a laminated film including a buffer layer and a gallium nitride base film and having a specific compressive stress is free from cracks.

It is an object of the present invention to provide a crack-free laminated film including a buffer layer and a gallium nitride base film and a structure including this laminated film.

Means for Solving the Problems

The present invention comprises the following aspects (1) to (11). The word "to", as used herein, includes numerical values at both ends thereof. More specifically, "X to Y" is synonymous with "X or more and Y or less".

(1) A laminated film comprising: a buffer layer; and at least one layer of gallium nitride base film disposed on the buffer layer, wherein a compressive stress of the entire laminated film is −2.0 to 5.0 GPa.

(2) The laminated film according to (1), wherein the compressive stress ranges from −1.4 to 5.0 GPa.

(3) The laminated film according to (1) or (2), wherein the laminated film is composed of 100 layers or less.

(4) A structure comprising: a substrate; and the laminated film according to any one of Claims (1) to (3) disposed on the substrate.

(5) The structure according to (4), wherein the substrate has a smaller thermal expansion coefficient than the gallium nitride base film.

(6) A semiconductor element comprising the laminated film according to any one of (1) to (3) or the structure according to (4) or (5).

(7) An electronic device comprising the semiconductor element according to (6).

(8) The laminated film according to any one of (1) to (3), wherein the gallium nitride base film is a film formed by a sputtering method using a sputtering target composed mainly of gallium nitride.

(9) The structure according to (4) or (5), wherein the gallium nitride base film is a film formed by a sputtering method using a sputtering target composed mainly of gallium nitride.

(10) A method for producing the laminated film according to any one of (1) to (3) and (8), including:

placing a substrate with a buffer layer in a chamber; placing a target composed mainly of gallium nitride at an angle in the range of 10 to 60 degrees with respect to a direction perpendicular to a surface of the substrate; and forming a gallium nitride base film on the buffer layer by a sputtering method at a gas pressure of 5.0 Pa or less while maintaining a relative positional relationship between the substrate and the target.

(11) A method for producing the structure according to any one of (4), (5), and (9), including:

placing a substrate with a buffer layer in a chamber; placing a target composed mainly of gallium nitride at an angle in the range of 10 to 60 degrees with respect to a direction perpendicular to a surface of the substrate; and forming a gallium nitride base film on the buffer layer by a sputtering method at a gas pressure of 5.0 Pa or less while maintaining a relative positional relationship between the substrate and the target.

Effects of the Invention

The present invention provides a crack-free laminated film including a buffer layer and a gallium nitride base film and a structure including this laminated film.

BRIEF DESCRIPTION OF THE DRAWINGS

FIG. 1 illustrates an example of a laminated film and a structure.

PREFERRED MODE FOR CARRYING OUT THE INVENTION

Specific embodiments of the present invention (hereinafter referred to as "the present embodiments") are described below. The present invention is not limited to the following embodiments, and various modifications can be made without changing the gist of the present invention.

<<1. Laminated Film>>

A laminated film according to the present embodiment includes a buffer layer and at least one layer of gallium nitride base film disposed on the buffer layer. This laminated film has a total compressive stress in the range of −2.0 to 5.0 GPa. The buffer layer can prevent atoms in the substrate from diffusing into the gallium nitride base film and consequently improve the crystallinity of the gallium nitride base film. This enables stress control by the compressive stress in the gallium nitride base film and can provide a crack-free laminated film.

The material of the buffer layer is not particularly limited. The material may be a diamond film, a zinc oxide film, a graphene film, a gallium oxide film, a boron nitride base film, an aluminum nitride base film, an indium nitride base film, or a thallium nitride base film. The aluminum nitride base film may be an aluminum nitride film or an aluminum nitride film containing an element other than aluminum and nitrogen. Specific examples include an aluminum nitride film, an aluminum gallium nitride film, and an aluminum indium gallium nitride film. The indium nitride base film may be an indium nitride film or an indium nitride film containing an element other than indium and nitrogen. Specific examples include an indium nitride film and an indium gallium nitride film. From the perspective of productivity, the buffer layer is preferably an aluminum nitride base film, and an aluminum nitride film is particularly preferred in terms of low production costs.

The buffer layer may have any thickness. To suppress atoms from diffusing from the substrate to a gallium nitride film, the thickness is preferably 3 nm or more, more preferably 5 nm or more, still more preferably 10 nm or more, 15 nm or more, 20 nm or more, 30 nm or more, or 50 nm or more. From the perspective of productivity, 1000 nm or less is preferred, 500 nm or less is more preferred, and 300 nm or less is still more preferred. For the thickness of the buffer layer, any combination of the upper limit and the lower limit described above is possible. For example, the thickness may range from 3 to 1000 nm or 3 to 500 nm.

The laminated film according to the present embodiment includes at least one layer of gallium nitride base film in addition to the buffer layer. The gallium nitride base film is disposed on the buffer layer. Another type of layer may be disposed between the gallium nitride base film and the buffer layer. However, the gallium nitride base film is preferably in contact with the buffer layer without another layer interposed therebetween.

The gallium nitride base film is composed of gallium nitride or gallium nitride containing an atom other than gallium and nitrogen. Examples include a gallium nitride film, an aluminum gallium nitride film, an indium gallium nitride film, an aluminum indium gallium nitride film, and a gallium nitride film containing impurities, such as magnesium and/or silicon. Among these, a gallium nitride film or an aluminum gallium nitride film in which cracking is less likely to occur is preferred, and a gallium nitride film in which crystallinity is easily improved is particularly preferred. The potassium nitride base film is preferably a Ga-polar or N-polar film with a cubic 111 plane or a hexagonal 0002 plane as a main phase in terms of improved surface flatness.

The gallium nitride base film may have any thickness. From the perspective of stress control by the gallium nitride film, the thickness is preferably 3 nm or more, more preferably 5 nm or more, still more preferably 10 nm or more, 15 nm or more, 20 nm or more, 30 nm or more, or 50 nm or more. From the perspective of productivity, 5000 nm or less is preferred, 2000 nm or less is more preferred, and 1200 nm or less is still more preferred. For the thickness of the gallium nitride base film, any combination of the upper limit and the lower limit described above is possible.

The laminated film has a structure of a buffer layer/gallium nitride base film. Specific examples include a buffer layer/gallium nitride film, a buffer layer/aluminum gallium nitride film, a buffer layer/indium gallium nitride film, and a buffer layer/aluminum indium gallium nitride film. More specific examples include an aluminum nitride film/gallium nitride film, an aluminum nitride film/aluminum gallium nitride film, an aluminum nitride film/indium gallium nitride film, an aluminum nitride film/aluminum indium gallium nitride film, an aluminum gallium nitride film/gallium nitride film, an aluminum gallium nitride film/indium gallium nitride film, and an aluminum gallium nitride film/aluminum indium gallium nitride film. These laminated films are preferred in terms of productivity. Among them, an aluminum nitride film/gallium nitride film is particularly preferred in terms of production costs.

The laminated film may include a film other than the buffer layer and the gallium nitride base film. For example, another type of layer may be disposed between the buffer layer and the gallium nitride base film. Alternatively, another type of layer may be disposed on the gallium nitride base film. Such a film may be an aluminum nitride film, an indium nitride film, an aluminum gallium nitride film, an indium gallium nitride film, or an indium aluminum gallium nitride film.

In the laminated film according to the present embodiment, the compressive stress of the entire laminated film ranges from −2.0 to 5.0 GPa. The compressive stress of the gallium nitride base film enables stress control and consequently can provide a crack-free laminated film. To suppress cracking in the outermost film, the compressive stress preferably ranges from −1.4 to 5.0 GPa. The compressive stress can be calculated from the radius of curvature of a crack-free substrate.

The compressive stress of the entire laminated film is limited to −2.0 GPa or more. An excessively small compressive stress may result in a large stress on the tension side and cracking in the film. The compressive stress is preferably −1.2 GPa or more, more preferably −1.0 GPa or more, −0.8 GPa or more, −0.6 GPa or more, −0.5 GPa or more, −0.4 GPa or more, −0.2 GPa or more, −0.1 GPa or more, 0 GPa or more, 0.1 GPa or more, or 0.2 GPa or more.

The compressive stress of the entire laminated film is limited to 5.0 GPa or less. An excessively large compressive stress may result in large warping of the substrate, adversely affect the performance of the gallium nitride base film, and make it difficult to send the laminated film to a normal device process. The compressive stress is more preferably 4.5 GPa or less, 4.0 GPa or less, 3.5 GPa or less, 3.2 GPa or less, 3.0 GPa or less, 2.5 GPa or less, 2.0 GPa or less, 1.5 GPa or less, 1.0 GPa or less, 0.9 GPa or less, or 0.8 GPa or less.

For the compressive stress, any combination of the upper limit and the lower limit described above is possible.

A laminated film with a larger number of laminated layers may have higher production costs and lower productivity. Thus, the number of layers constituting the laminated film is preferably 100 or less, more preferably 50 or less, still more preferably 20 or less, particularly preferably 10 or less. The number of layers may be 9 or less, 8 or less, 7 or less, 6 or less, 5 or less, 4 or less, 3 or less, or 2 or less. In the present description, a layered structure including two or more layers (films) with discontinuous compositions is referred to as a laminated film. A layer (film) with a continuously varying composition is regarded as one layer.

In consideration of productivity, the laminated film preferably has a total thickness of 5 μm or less. The film thickness can be measured with a field-emission transmission electron microscope through TEM cross-sectional observation.

<<2. Structure>>

A structure according to the present embodiment includes a substrate and a laminated film disposed on the substrate. The structure of the laminated film is described above.

The substrate is not particularly limited. From the perspective of productivity, silicon, silicon carbide, zinc oxide, sapphire, gallium arsenide, gallium nitride, or the like is preferred. A substrate with a smaller thermal expansion coefficient than the gallium nitride base film is preferred. This is because a compressive stress can be applied directly to the gallium nitride base film. For example, a substrate with a thermal expansion coefficient equal to or lower than the thermal expansion coefficient ($5.59\times10^{-6}$/K) of the gallium nitride film may be a substrate composed of silicon (thermal expansion coefficient: $2.59\times10^{-6}$/K), silicon carbide (4 to $5\times10^{-6}$/K), or zinc oxide ($4.75\times10^{-6}$/K). Among them, a substrate composed of silicon or silicon carbide into which oxygen is less likely to enter as an impurity when a gallium nitride base thin film is formed is preferred. A silicon (111) substrate on which the crystallinity of the gallium nitride base film is improved or a 4H-silicon carbide (0001) substrate with an off-angle of 4 degrees is more preferred. A silicon (111) substrate is particularly preferred in terms of substrate cost.

A specific example of the structure may be a silicon/aluminum nitride base film/gallium nitride base film, a silicon/aluminum nitride base film/gallium nitride base film/aluminum nitride base film, a silicon carbide/aluminum nitride base film/gallium nitride base film, a silicon carbide/aluminum nitride base film/gallium nitride base film/aluminum nitride base film, a silicon/(aluminum nitride base film/gallium nitride base film)×n (n denotes a natural number), a silicon/(aluminum nitride base film/gallium nitride base film)×n (n denotes a natural number)/aluminum nitride base film, a silicon carbide/(aluminum nitride base film/gallium nitride base film)×n (n denotes a natural number), or a silicon carbide/(aluminum nitride base film/gallium nitride base film)×n (n denotes a natural number)/aluminum nitride base film. For n=2 or more, a portion other than the outermost layer preferably includes at least one layer of gallium nitride base film. This is because cracking is less likely to occur.

Particularly preferred are a silicon/aluminum nitride film/gallium nitride film, a silicon/aluminum nitride film/gallium nitride film/aluminum nitride film, a silicon carbide/aluminum nitride film/gallium nitride film, a silicon carbide/aluminum nitride film/gallium nitride film/aluminum nitride film, a silicon/(aluminum nitride film/gallium nitride film/)×n (n denotes a natural number), a silicon/(aluminum nitride film/gallium nitride film/)×n (n denotes a natural number)/aluminum nitride film, a silicon carbide/(aluminum nitride film/gallium nitride film)×n (n denotes a natural number), and a silicon carbide/(aluminum nitride film/gallium nitride film/)×n (n denotes a natural number)/aluminum nitride film. This is because the production costs are reduced, and the single layer improves the crystallinity.

n is preferably 50 or less. The production costs are reduced as the number of layers decreases. Thus, n=40, 30, 20, 10, 9, 8, 7, 6, 5, 4, 3, 2, or 1 is more preferred.

In consideration of productivity, the laminated film preferably has a total thickness of 5 μm or less. The film thickness can be measured with a field-emission transmission electron microscope through TEM cross-sectional observation.

FIG. 1 illustrates an example of the laminated film and the structure. A laminated film (6) includes a buffer layer (2) and at least one layer of gallium nitride base film (4) disposed on the buffer layer (2). The structure (10) includes a substrate (8) and the laminated film (6) disposed on the substrate (8). Although FIG. 1 shows a monolayer gallium nitride base film, the gallium nitride base film is not limited to a single layer. The laminated film may include a plurality of gallium nitride base films. It goes without saying that another type of layer may be disposed between the buffer layer and the gallium nitride base film or on the gallium nitride base film.

<<3. Semiconductor Element>>

The laminated film or structure according to the present embodiment is suitably used for a semiconductor element provided with a plurality of functional components. For example, it is used for light-emitting elements, such as LEDs and laser diodes, and power devices, such as diodes and transistors. The semiconductor element is suitably used for various electronic devices.

<<3. Method for Producing Laminated Film and Structure>>

In a method for producing a laminated film or structure according to the present embodiment, a laminated film, which includes a gallium nitride base film formed by a sputtering method using a sputtering target composed mainly of gallium nitride, is produced. More specifically, the method includes placing a substrate with a buffer layer in a chamber, placing a target composed mainly of gallium nitride at an angle in the range of 10 to 60 degrees with respect to a direction perpendicular to a surface of the substrate, and forming a gallium nitride base film on the buffer layer by a sputtering method at a gas pressure of 5.0 Pa or less while maintaining a relative positional relationship between the substrate and the target. The details of the buffer layer, the gallium nitride base film, and the substrate are described above.

The sputtering method is not particularly limited. It can be appropriately selected from a DC sputtering method, an RF sputtering method, an AC sputtering method, a DC magnetron sputtering method, an RF magnetron sputtering method, a DC pulse sputtering method, a pulse laser sputtering method, an ion-beam sputtering method, and the like. Among these, a DC magnetron sputtering method, a DC pulse sputtering method, or an RF magnetron sputtering method, which can uniformly and rapidly form a film over a large area, is preferred.

In the production method according to the present embodiment, a substrate with a buffer layer is disposed in a chamber. A target composed mainly of gallium nitride is disposed at an angle in the range of 10 to 60 degrees with respect to a direction perpendicular to a surface of the substrate on which the buffer layer is disposed, and a gallium nitride base film is formed on the buffer layer while maintaining the relative positional relationship between the substrate and the target. Thus, the target is disposed at a position inclined from the direction perpendicular to the substrate surface (or the surface of the buffer layer) to form a film by sputtering. The tilt angle between the direction perpendicular to the substrate surface and the target position ranges from 10 to 60 degrees. The tilt angle preferably ranges from 15 to 55 degrees, more preferably 20 to 50 degrees.

The inclined target position can reduce the occurrence of cracks in the laminated film. Thus, sputtered particles with a component parallel to the substrate surface are incident on the substrate. Thus, sputtered particles push atoms on the substrate surface in a direction parallel to the substrate surface. This increases the compressive stress in the direction parallel to the substrate surface and reduces the occurrence of cracks. It can be said that the incident direction of sputtered particles includes an appropriate mixture of a horizontal component and a vertical component and thereby achieves stress control.

By contrast, sputtering with a target disposed at a position sufficiently perpendicular or horizontal to the substrate surface makes stress control difficult in the laminated film and a structure including the laminated film. For example, with a target disposed perpendicular to the substrate surface, a smaller fraction of the incident component of sputtered particles is horizontal to the substrate surface, and stress control is consequently difficult to achieve. With a target disposed horizontal to the substrate surface, sputtered particles reaching the substrate have low energy, and stress control is difficult to achieve.

In the production method according to the present embodiment, the gas pressure for sputtering is 5.0 Pa or less. At a lower gas pressure for sputtering, particles emitted from a sputtering target can more easily reach the substrate in a high-energy state. Thus, the reached particles are easily rearranged for epitaxial growth. The gas pressure is preferably 3.0 Pa or less. Furthermore, to stabilize electrical discharge while sputtering, the gas pressure is preferably 0.05 Pa or more. For the gas pressure, any combination of the upper limit and the lower limit described above is possible.

Sputtering under such conditions can form a hexagonal gallium nitride base film and increase the compressive stress of the gallium nitride base film. This is probably because accelerated ions and neutralized atoms in the discharge gas reach the substrate with higher energy. It is considered that surface atoms are driven into the inside by an atomic peening effect, and ions and atoms trapped in a film diffuse into the inside by grain boundary diffusion, which causes volume expansion of a thin film. For high coverage, the film preferably does not contain another crystal phase.

The oxygen content of a sputtering target to be used is preferably less than 3% by atom, more preferably 1% or less by atom, still more preferably 0.5% or less by atom. This can increase the crystallinity of the entire film. Furthermore, the target preferably has a higher purity. The metal impurity content is preferably less than 0.1% by weight, more preferably less than 0.01% by weight. It should be noted that the impurities do not include intentionally added components, such as indium and aluminum. The sputtering target preferably has an area of 18 $cm^2$ or more, more preferably 100 $cm^2$ or more. This is because a larger target area results in more stable electrical discharge, which enables sputtering at a lower gas pressure and at a lower power density, as well as improved uniformity of the film thickness and film quality. The target area is the area of a surface of the target facing the substrate during sputtering.

The degree of vacuum for production in the apparatus (chamber) is preferably $3\times10^{-5}$ Pa or less, more preferably $1\times10^{-5}$ Pa or less. This is because a higher degree of vacuum results in reduced contamination with residual gases as impurities and consequently a thin film with improved crystallinity. The apparatus is preferably baked to remove residual gases.

The substrate is preferably pretreated in advance. This is because pretreatment removes obstacles adhering to the substrate surface and promotes epitaxial growth. The pretreatment method may be reverse sputtering, acid treatment, or UV treatment. Pretreatment suitable for the substrate to be used is preferably performed as required. For example, a silicon substrate is preferably subjected to acid treatment with hydrofluoric acid. In this case, the silicon substrate may be allowed to stand in 5% hydrofluoric acid for 15 seconds or more. The treatment time preferably ranges from 15 to 900 seconds. This can remove impurities from the substrate surface and can provide a preferred surface state.

The sputtering is preferably performed by heating the substrate to a temperature of 800° C. or less. This is because heating the substrate promotes the diffusion of sputtered particles on the substrate surface and improves crystallinity. The gallium nitride base film is expected to decompose at a temperature of more than 800° C., and therefore the heating temperature is preferably 800° C. or less.

A gas composed mainly of nitrogen is used. The film may be formed using only nitrogen or commonly used nitrogen containing some argon.

The power density during electrical discharge preferably ranges from 0.2 to 20 W/$cm^2$, more preferably 0.3 to 10 W/$cm^2$, still more preferably 0.4 to 5 W/$cm^2$. The power density is calculated by dividing the electric power applied during electrical discharge by the area of the sputtering target. The sputtering target typically has a low density. Thus, at a power density of more than 20 W/$cm^2$, due to the power applied to the target composed mainly of gallium nitride used, coarse polycrystalline particles may be separated from the sputtering target. On the other hand, at a power density of less than 0.2 W/$cm^2$, electrical discharge is difficult to be generated due to unstable plasma. Furthermore, the productivity of the film may be reduced due to a decreased film-forming rate during production. In addition, the adhesion strength of the film may be reduced due to low energy for sputtering.

A gallium nitride base film may be formed by another method on the formed gallium nitride base film. For example, a gallium nitride base film may be formed by a MOCVD method on a gallium nitride base film formed by a sputtering method.

EXAMPLES

The present invention is described in more detail in the following examples and comparative examples. However, the present invention is not limited to these examples.

(1) Preparation of Laminated Film and Structure

Examples 1 to 7

In Examples 1 to 7, a structure composed of silicon (Si)/aluminum nitride (AlN)/gallium nitride (GaN) was prepared. In Examples 1 to 5, a gallium nitride (GaN) film was formed by a sputtering method on a surface of a Si (111) substrate including an aluminum nitride (Al) film. In Examples 6 and 7, an aluminum nitride (AlN) film and a gallium nitride (GaN) film were sequentially formed on a surface of a silicon substrate by a sputtering method. The aluminum nitride (AlN) film corresponds to a buffer layer, and the gallium nitride (GaN) film corresponds to a gallium nitride base film. Tables 1 to 3 show the film-forming conditions of Examples 1 to 7.

Examples 8 to 11

In Examples 8 to 11, a structure composed of silicon carbide (SiC)/aluminum nitride (AlN)/gallium nitride (GaN) was prepared. More specifically, an aluminum nitride (AlN) film and a gallium nitride (GaN) film were sequentially formed by a sputtering method on a surface of a 4H-silicon carbide (0001) substrate with an off-angle of 4 degrees. Table 4 shows the film-forming conditions of Examples 8 to 11.

Comparative Example 1

In Comparative Example 1, a structure composed of silicon (Si)/aluminum nitride (AlN)/gallium nitride (GaN) was prepared. More specifically, a gallium nitride (GaN) film was formed on a silicon (Si) (111) substrate by a metal-organic chemical vapor deposition (MOCVD) method. Table 6 shows the film-forming conditions of Comparative Example 1.

Comparative Example 2

In Comparative Example 2, a structure composed of sapphire ($Al_2O_3$)/gallium nitride (GaN) was prepared. More specifically, a gallium nitride (GaN) film was formed on a sapphire ($Al_2O_3$) (0001) substrate by a sputtering method. Table 7 shows the film-forming conditions of Comparative Example 2.

(2) Evaluation

Various characteristics of the structures (laminated films) prepared in Examples 1 to 11 and Comparative Examples 1 and 2 were evaluated as described below.

<Film Thickness>

The thicknesses of the AlN film (buffer layer) and the GaN film (gallium nitride base film) were determined through TEM cross-sectional observation. First, a carbon coat was formed as a protective film on a surface of a sample (a laminated film and a structure including the laminated film). A sample for observation was then prepared by focused ion beam (FIB) processing. A cross section of the sample was then observed with a field-emission transmission electron microscope (JEOL Ltd., JEM-2100F). The electron beam accelerating voltage was 200 kV.

<Radius of Curvature>

The surface conditions of a sample (circular substrate) were examined with a surface roughness tester (Mitutoyo Corporation, Surftest SV-3100). A standard stylus (12AAB403), a skidless nosepiece (12AAB355), and a detector (No. 178-397-2) were used, and the measuring force was 4 mN.

First, the tester was calibrated with a roughness standard Surftest (Mitutoyo Corporation). The roughness standard Surftest had Ra=2.92 μm and Ry=11.3 μm. A sample (substrate) was then placed with a convex surface facing upward and was measured on a length of 80% of the diameter or the long side through the position of the center of gravity of the structure such that the center of gravity was the midpoint of the measurement straight line. For example, for a two-inch substrate, measurement was performed on a length of 40 mm. A two-inch substrate with one orientation flat was measured on a length of 40 mm along a straight line with the maximum diameter of the substrate parallel to the orientation flat through the center position of the straight line such that the center position of the straight line was the midpoint of the measurement straight line. On the other hand, a square or rectangular substrate was measured through the center of the substrate parallel to a side in the range of 80% of the length of the long side. A square substrate was measured through the center of the substrate parallel to a side in the range of 80% of the length of the side from two orthogonal directions. A rectangular substrate with a difference in the length of the four sides being less than 1 mm was regarded as a square substrate. A substrate with a plurality of orientation flats was measured by the above method in a direction parallel to the longest orientation flat. A substrate with a plurality of orientation flats of the same length was measured by the above method for all the orientation flats in a direction parallel to the corresponding orientation flat. A substrate with one notch was measured by placing the substrate such that the distance between the measurement line of the above method and the notch was maximum. A substrate with a plurality of notches was measured for all the notches by placing the substrate such that the distance between the measurement line of the above method and the corresponding notch was maximum. A substrate with both an orientation flat and a notch was measured by the above method in a direction parallel to the orientation flat.

The radius of curvature was then calculated based on the measured data. The radius of curvature was calculated using a contour and roughness analysis program (Mitutoyo Corporation, FORMTRACEPAK) and by a circular measurement analysis specifying the whole range of the measurement range of the surface roughness tester. The measurement was performed three times in one measurement direction, and the average measured value was defined as a radius of curvature. For the measurement on one substrate in a plurality of directions, the measurement was performed three times in each direction, and the smallest absolute value of the calculated average curvature radii was regarded as the radius of curvature. When the measurement result of the radius of curvature was concave, that is, when the substrate surface was concave, the measurement was performed three times on the opposite surface in the same manner, and the average value thus determined was regarded as the radius of curvature.

In the measurement with the surface roughness tester, the radius of curvature of a convex film surface was expressed as a positive real number, and the radius of curvature of a convex substrate surface was expressed as a negative real number.

<Internal Stress>

The internal stress σ was calculated using the following Stoney's equation (1) from the film thickness and the radius of curvature. In the equation (1), $E_S$ denotes Young's modulus of the substrate, $t_s$ denotes the thickness of the substrate, $v_s$ denotes Poisson's ratio of the substrate, R denotes the radius of curvature, and $t_F$ denotes the total thickness of the thin film (laminated film).

[Math. 1]

$$\sigma = \frac{E_s t_s^2}{6(1 - v_s R) t_F} \quad (1)$$

Table 9 summarizes Young's modulus, Poisson's ratio, and the thickness of the substrates in Examples 1 to 11 and Comparative Examples 1 and 2. Young's modulus and Poisson's ratio of the silicon substrate in Examples 1 to 7 were described in a reference document (V. A. Sethuraman et al., Electrochemistry Communications, 12, (2010), 1614-1617). Young's modulus and Poisson's ratio of the silicon carbide substrate in Examples 8 to 11 were described in a reference document (E. Konstantinova et al., Intermetallics, 16, (2008), pp. 1040-1042). Young's modulus and Poisson's ratio of the sapphire substrate in Comparative Example 2 were described in the general catalog of Shinkosha Co., Ltd.

The thickness of each substrate and structure were measured with a Digimatic micrometer (Mitutoyo Corporation, MDC-25MJT). More specifically, the thickness was measured at three points: the position of the center of gravity of the substrate, an edge of the substrate or structure on the extension line of the measurement line in the measurement of the radius of curvature, and an edge perpendicular to the measurement line and on the extension line of the line passing through the position of the center of gravity, and the average value thereof was taken as the thickness of the substrate or structure. The thickness of the substrate in the structure was calculated by subtracting the total thickness of the thin film (laminated film) from the thickness of the structure.

<Presence or Absence of Cracks>

A sample (substrate) was mounted on a sample stage of a shape analysis laser microscope (Keyence Corporation, VK-X200) and was observed with a 50× objective lens. The presence or absence of linear cracks was examined.

<Crystal Structure of GaN Film>

The crystal phase and polarity of a gallium nitride thin film (GaN film) were evaluated with a time-of-flight atomic scattering surface analyzer (Pascal Co., Ltd., TOFLAS-3000). A sample (laminated film structure) was set in the apparatus such that the film formation surface faced upward, and the measurement was performed. A pole FIGURE measured was compared with a pole FIGURE of each crystal phase and polarity of up to four surface layers obtained by simulation to determine the polarity and crystal phase of the gallium nitride thin film. The measurement conditions are described below.

Probe: He (atomic scattering)

Energy: 3 keV

Distance between beam source and target: 805 mm

Distance between target and detector: 395 mm

Degree of vacuum of analysis room: $2\times10^{-3}$ Pa or less (3) Results

Table 1 shows the evaluation results of the structures (laminated films) of Examples 1 to 5. Table 3 shows the evaluation results of the structures (laminated films) of Examples 6 and 7. Table 5 shows the evaluation results of the structures (laminated films) of Examples 8 to 11. Table 8 shows the evaluation results of the structures (laminated films) of Comparative Examples 1 and 2.

TABLE 1

Film-forming conditions and compressive stress values of silicon/AlN/GaN

| | Substrate | Substrate size | GaN film-forming method | Target | Power density (W/cm$^2$) | Gas Pressure (Pa) | Inlet gas Nitrogen (sccm) | Inlet gas Argon (sccm) |
|---|---|---|---|---|---|---|---|---|
| Example 1 | Silicon[Note 1] | 2 inch | Sputtering | GaN | 0.9 | 0.1 | 25 | 0 |
| Example 2 | Silicon[Note 1] | 2 inch | Sputtering | GaN | 0.9 | 0.1 | 20 | 0 |
| Example 3 | Silicon[Note 1] | 2 inch | Sputtering | GaN | 0.9 | 1.5 | 30 | 0 |
| Example 4 | Silicon[Note 1] | 2 inch | Sputtering | GaN | 0.9 | 1.5 | 30 | 0 |
| Example 5 | Silicon[Note 1] | 2 inch | Sputtering | GaN | 0.9 | 3.0 | 30 | 0 |

| | Tilt angle (°) | Substrate temperature (° C.) | AlN film thickness (nm) | GaN film thickness (nm) | Compressive stress value (GPa) | Crack | Radius of curvature (mm) | Crystal structure |
|---|---|---|---|---|---|---|---|---|
| Example 1 | 30 | 800 | 217 | 109 | −1.11 | None | −9364 | Cubic crystal |
| Example 2 | 30 | 800 | 218 | 488 | −0.10 | None | −44764 | Hexagonal crystal (Ga polarity) |
| Example 3 | 30 | 800 | 208 | 106 | −1.14 | None | −9097 | Cubic crystal |
| Example 4 | 30 | 800 | 205 | 503 | −0.46 | None | −10310 | Cubic crystal |
| Example 5 | 30 | 800 | 219 | 117 | −1.21 | None | −8084 | Hexagonal crystal (Ga polarity) |

*Note* 1

Silicon (111)/AlN substrate manufactured by Kyma, Prime grade

TABLE 2

Film-forming conditions of silicon/AlN/GaN

| | Substrate | Substrate size | AlN film-forming method | Target | Power density (W/cm2) | Gas pres sure (Pa) | Tilt angle (°) | Substrate temperature (° C.) |
|---|---|---|---|---|---|---|---|---|
| Example 6 | Silicon | 2 inch | Sputtering | Al | 2.5 | 0.3 | 30 | 700 |
| Example 7 | Silicon | 2 inch | Sputtering | Al | 2.5 | 0.3 | 30 | 700 |

| | GaN film-forming method | Target | Power density (W/cm$^2$) | Gas pressure (Pa) | Tilt angle ( ° ) | Substrate temperature (° C.) |
|---|---|---|---|---|---|---|
| Example 6 | Sputtering | GaN | 0.9 | 0.1 | 30 | 800 |
| Example 7 | Sputtering | GaN | 0.9 | 0.1 | 30 | 800 |

TABLE 3

Compressive stress value of silicon/AlN/GaN

| | Substrate | Substrate size | AlN film thickness (nm) | GaN film thickness (nm) | Compressive stress value (GPa) | Crack | Radius of curvature (mm) | Crystal structure |
|---|---|---|---|---|---|---|---|---|
| Example 6 | Silicon | 2 inch | 104 | 93 | 0.25 | None | 70337 | Hexagonal crystal (Ga polarity) |
| Example 7 | Silicon | 2 inch | 107 | 420 | 0.75 | None | 9330 | Hexagonal crystal (Ga polarity) |

TABLE 4

Film-forming conditions of silicon carbide/AlN/GaN

| | Substrate | AlN film-forming method | Target | Power density (W/cm$^2$) | Ga s pressure (Pa) | Tilt angle (°) | Substrate temperature (° C.) |
|---|---|---|---|---|---|---|---|
| Example 8 | Silicon carbide | Sputtering | Al | 2.5 | 0.3 | 30 | 700 |
| Example 9 | Silicon carbide | Sputtering | Al | 2.5 | 0.3 | 30 | 700 |
| Example 10 | Silicon carbide | Sputtering | Al | 2.5 | 0.3 | 30 | 700 |
| Example 11 | Silicon carbide | Sputtering | Al | 2.5 | 0.3 | 30 | 700 |

| | GaN film-forming method | Target | Power density (W/cm$^2$) | Gas pressure (Pa) | Tilt angle (°) | Substrate temperature (° C.) |
|---|---|---|---|---|---|---|
| Example 8 | Sputtering | GaN | 0.9 | 0.1 | 30 | 800 |
| Example 9 | Sputtering | GaN | 0.9 | 0.1 | 30 | 800 |
| Example 10 | Sputtering | GaN | 0.9 | 0.1 | 30 | 800 |
| Example 11 | Sputtering | GaN | 0.9 | 0.1 | 30 | 800 |

TABLE 5

Compressive stress value of silicon carbide/AlN/GaN

| | Substrate | AlN film thickness (nm) | GaN film thickness (nm) | Compressive stress value (GPa) | Crack | Radius of curvature (mm) | Crystal structure |
|---|---|---|---|---|---|---|---|
| Example 8 | Silicon carbide | 105 | 109 | 3.27 | None | 13667 | Hexagonal crystal (Ga polarity) |
| Example 9 | Silicon carbide | 102 | 502 | 0.91 | None | 18611 | Hexagonal crystal (Ga polarity) |
| Example 10 | Silicon carbide | 95 | 560 | 0.70 | None | 20509 | — |
| Example 11 | Silicon carbide | 95 | 1146 | 0.35 | None | 22462 | — |

Note 1)
denotes not measured.

TABLE 6

Film-forming conditions of silicon/AlN/GaN

| | Substrate | GaN film-forming method | Compressive stress value (GPa) | Crack |
|---|---|---|---|---|
| Comparative Example 1 | Silicon | MOCVD | — | Yes |

TABLE 7

Film-forming conditions of Sapphire/GaN

| | Substrate | GaN film-forming method | Target | Power density (W/cm$^2$) | Gas pressure (Pa) | Tilt angle (°) | Substrate temperature (° C.) |
|---|---|---|---|---|---|---|---|
| Comparative Example 2 | Sapphire | Sputtering | GaN | 2.2 | 0.07 | 30 | 200 |

TABLE 8

Compressive stress value, presence or absence of cracks, and radius of curvature

| | Substrate | AlN film thickness (nm) | GaN film thickness (nm) | Compressive stress value (GPa) | Crack | Radius of curvature (mm) |
|---|---|---|---|---|---|---|
| Comparative Example 1 | Silicon | 342 | 612 | — | Yes | — |
| Comparative Example 2 | Sapphire | — | 1129 | 10.96 | None | 1926 |

TABLE 9

Young's modulus, Poisson ratio, and thickness of substrate

| | Substrate | Young's modulus (GPa) | Poisson ratio | Substrate thickness (μm) |
|---|---|---|---|---|
| Example 1 | Silicon | 169 | 0.26 | 298 |
| Example 2 | Silicon | 169 | 0.26 | 289 |
| Example 3 | Silicon | 169 | 0.26 | 293 |
| Example 4 | Silicon | 169 | 0.26 | 297 |
| Example 5 | Silicon | 169 | 0.26 | 294 |
| Example 6 | Silicon | 169 | 0.26 | 303 |
| Example 7 | Silicon | 169 | 0.26 | 311 |
| Example 8 | Silicon carbide | 448.2 | 0.134 | 333 |
| Example 9 | Silicon carbide | 448.2 | 0.134 | 345 |
| Example 10 | Silicon carbide | 448.2 | 0.134 | 329 |
| Example 11 | Silicon carbide | 448.2 | 0.134 | 337 |
| Comparative Example 2 | Sapphire | 460 | 0.16 | 511 |

The invention claimed is:

1. A laminated film, comprising:

a buffer layer consisting of AlN; and at least one layer of gallium nitride base film consisting of GaN disposed on the buffer layer, wherein a compressive stress of the entire laminated film is −2.0 to 5.0 GPa, and the at least one layer of gallium nitride base film is disposed to directly contact the buffer layer.

2. The laminated film according to claim 1, wherein the compressive stress ranges from −1.4 to 5.0 GPa.

3. The laminated film according to claim 1, wherein the laminated film is composed of 100 layers or less.

4. A structure comprising:

a substrate; and the laminated film according to claim 1 disposed on the substrate.

5. The structure according to claim 4, wherein the substrate has a smaller thermal expansion coefficient than the gallium nitride base film.

6. A semiconductor element comprising the laminated film according to claim 1.

7. An electronic device comprising the semiconductor element according to claim 6.

8. The laminated film according to claim 1, wherein the gallium nitride base film is a film formed by a sputtering method using a sputtering target composed mainly of gallium nitride.

9. The structure according to claim 4, wherein the gallium nitride base film is a film formed by a sputtering method using a sputtering target composed mainly of gallium nitride.

10. A method for producing the laminated film according to claim 1, comprising:

placing a substrate with a buffer layer in a chamber;

placing a target composed mainly of gallium nitride at an angle in the range of 10 to 60 degrees with respect to a direction perpendicular to a surface of the substrate; and forming a gallium nitride base film on the buffer layer by a sputtering method at a gas pressure of 5.0 Pa or less while maintaining a relative positional relationship between the substrate and the target.

11. A method for producing the structure according to claim 4, comprising:

placing a substrate with a buffer layer in a chamber;

placing a target composed mainly of gallium nitride at an angle in the range of 10 to 60 degrees with respect to a direction perpendicular to a surface of the substrate; and forming a gallium nitride base film on the buffer layer by a sputtering method at a gas pressure of 5.0 Pa or less while maintaining a relative positional relationship between the substrate and the target.

* * * * *